(12) United States Patent
Okabe et al.

(10) Patent No.: US 6,757,178 B2
(45) Date of Patent: Jun. 29, 2004

(54) ELECTRONIC CIRCUIT EQUIPMENT USING MULTILAYER CIRCUIT BOARD

(75) Inventors: Hiroshi Okabe, Kokubunji (JP); Hirozi Yamada, Shiroyama (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/044,910

(22) Filed: Jan. 15, 2002

(65) Prior Publication Data

US 2002/0118523 A1 Aug. 29, 2002

(30) Foreign Application Priority Data

Feb. 23, 2001 (JP) ........................................ 2001-047546

(51) Int. Cl.⁷ ............................. H05K 1/11; H05K 1/14
(52) U.S. Cl. ........................ 361/793; 361/766; 361/795
(58) Field of Search ................................ 361/760–766; 174/255–260

(56) References Cited

U.S. PATENT DOCUMENTS

| | | | |
|---|---|---|---|
| 5,027,253 A | | 6/1991 | Lauffer et al. ............... 361/321 |
| 6,021,050 A | * | 2/2000 | Ehman et al. ............... 361/793 |
| 6,153,290 A | * | 11/2000 | Sunahara ..................... 428/210 |
| 6,252,761 B1 | * | 6/2001 | Branchevsky ............ 361/321.2 |
| 6,319,542 B1 | * | 11/2001 | Summerfelt et al. .......... 427/79 |
| 6,353,540 B1 | * | 3/2002 | Akiba et al. ................. 361/794 |
| 6,370,013 B1 | * | 4/2002 | Iino et al. ................. 361/306.3 |
| 6,388,207 B1 | * | 5/2002 | Figueroa et al. ............ 174/262 |
| 6,407,929 B1 | * | 6/2002 | Hale et al. ................... 361/763 |
| 6,410,858 B1 | * | 6/2002 | Sasaki et al. ................ 174/255 |

* cited by examiner

*Primary Examiner*—Kamand Cuneo
*Assistant Examiner*—Tuan Dinh
(74) *Attorney, Agent, or Firm*—Miles & Stockbridge P.C.

(57) ABSTRACT

In an electronic circuit equipment using a multilayer circuit board on which a semiconductor chip is mounted, a thin film capacitor is provided on the multilayer circuit board. Moreover, a first electrode of the thin film capacitor and a first wiring of the multilayer circuit board are electrically connected to each other, and a second electrode of the thin film capacitor and a second wiring of the multilayer circuit board are electrically connected to each other, respectively. Furthermore, a thin film dielectric of the thin film capacitor was grown epitaxially with the first electrode as its base. The employment of the multilayer circuit board makes it possible to provide the electronic circuit equipment using the multilayer circuit board that includes the built-in thin film capacitor having the high dielectric-constant thin film dielectric.

13 Claims, 3 Drawing Sheets

ELECTRONIC CIRCUIT EQUIPMENT USING MULTILAYER CIRCUIT BOARD

BACKGROUND OF THE INVENTION

1. Field of the Invention

The present invention relates to electronic circuitry using a multilayer circuit board that includes a buried capacitor.

2. Description of the Prior Art

In accompaniment with the downsizing of portable equipment, a technology for forming a passive component such as a capacitor within the board in order to enhance the mounting density has become more prevalent, especially in cellular phones. The technology that is in the mainstream at present employs a ceramic board. Attention, however, is now focused on a resin-based board with passive elements built in, because such a board is light-weight, not subject to cracking, inexpensive, etc. When forming a capacitor within a board, employing a thin film capacitor whose capacitive density can be made higher is advantageous in downsizing the board. U.S. Pat. No. 5,027,253 has disclosed a conventional technology concerning a board in which the thin film capacitor is buried. This technology will be explained below, using FIG. 4. The board includes a first signal core 121 including a first thin film copper wiring 123 that has a first thin film copper electrode 125, a second signal core 131 including a second thin film copper wiring 123 that has a second thin film copper electrode 135 which overlays the first thin film copper electrode, and an epitaxial thin film 151 of a dielectric material positioned between the first thin film copper electrode and the second thin film copper electrode. Here, the first thin film copper electrode, the second thin film copper electrode, and the epitaxial thin film of the dielectric material form the integrally-buried type thin film capacitor 141 inside the multilayer circuit package 101. The first signal core and the second signal core are formed of a metal having a high electrical-conductivity, e.g., copper, silver, and aluminum. The epitaxial thin film of the dielectric material between the first thin film copper electrode and the second thin film copper electrode is formed of a sputtered film of ceramics, the representatives of which are, e.g., calcium titanate, barium titanate, aluminum oxide, beryllium oxide, and aluminum nitride. The formation of the structure like this makes it possible to implement, inside the package, the capacitor including the electrodes and the dielectric. Here, the electrodes have the electrical-conductivity higher than those of metals, e.g., Y, Ti, Zr, Ta, Hf, Nb, Mo, and W, and the dielectric has a dielectric-constant higher than those of oxides of, e.g., Y, Ti, Zr, Ta, Hf, Nb, Mo, and W. This implementation allows a capacitor element to be removed from the package surface, thereby enlarging a package surface available for a logic circuit chip/module and thus enhancing the package density.

In the conventional multilayer circuit package that U.S. Pat. No. 5,027,253 has proposed, there existed a problem that it is difficult to cause a ceramic, i.e., the dielectric material, to grow epitaxially on the first signal core. This is because the lattice constant of the metal such as copper, silver, and aluminum does not coincide with the lattice constant of the ceramic planned to grow on the metal. As a result, the sputtered thin film of the ceramic became more likely to exhibit an amorphous growth instead of the crystallization growth. The resultant amorphous thin film of the ceramic exhibits a lower dielectric-constant as compared with an epitaxial thin film that has grown by crystallization growth. Accordingly, the capacity value of a capacitor fabricated using this amorphous thin film becomes smaller than that of the capacitor fabricated using the epitaxial thin film.

Moreover, when employing the easily oxidized metal such as copper or aluminum as the first signal core, sputtering the oxide ceramic thereon resulted in the following problem or the like: The sputtering oxidizes the surface of the metal that forms the first signal core, thereby forming an oxide layer other than the ceramic thin film. This increases the thickness of the dielectric layer, thus lowering the capacity value.

Also, when the capacitor is built inside the multilayer circuit board, no limitation is imposed on the layout in order to enhance the mounting density. This condition makes it likely that a three-dimensional intersection will occur between the built-in capacitor and a signal line formed in a layer other than the layer where the capacitor has been formed. If the capacitor and the signal line intersect to each other, a signal interference occurs therebetween, thereby resulting in a problem that a deterioration occurs in the performance of the electronic circuit using this multilayer circuit board. In the conventional multilayer circuit package, no consideration has been given to the signal interference between the capacitor formed inside the multilayer circuit board and the signal line formed in the layer other than the layer where the capacitor has been formed.

Although there exist capacitors of a variety of uses, e.g., an impedance-matching capacitor and a bypass capacitor, as capacitors used in an electronic circuit, the performances required for the respective uses differ from each other. In order to downsize further the electronic circuit using the multilayer circuit board, it is required to build as many capacitors as possible inside the multilayer circuit board independently of the uses. However, if precision capacitors, e.g., impedance-matching capacitors, are built inside the multilayer circuit board, manufacturing variations in the capacity values become a serious problem. In the conventional multilayer circuit package, no consideration has been given to precision capacitors.

SUMMARY OF THE INVENTION

It is an object of the present invention to provide an electronic circuit equipment using a multi-layer circuit board that includes a built-in thin film capacitor having a high dielectric-constant thin film dielectric.

The above-described object of the present invention can be accomplished by the following method: In the electronic circuit equipment using the multi-layer circuit board on which a semiconductor chip is mounted, the thin film capacitor is provided on the multilayer circuit board. Next, a first electrode of the thin film capacitor and a first wiring of the multilayer circuit board are electrically connected to each other, and a second electrode of the thin film capacitor and a second wiring of the multilayer circuit board are electrically connected to each other, respectively. Finally, the thin film dielectric of the thin film capacitor is caused to grow epitaxially with the first electrode as its ground.

The employment of the method like this makes it possible to use, as the first electrode, a metal on the top portion of which the thin film dielectric can be grown epitaxially. The employment thereof also allows a high electrical-conductivity metal to be used as the first wiring conductor. As a result, it becomes possible to form, inside the multi-layer circuit board, the thin film capacitor including the high dielectric-constant thin film dielectric.

Here, the following configuration is employed: Of the electrical connection between the first electrode and the first wiring and the electrical connection between the second electrode and the second wiring, at least one of the connections is established via a hole (hereinafter, referred to as "via-hole" or "through-hole") bored in a resin forming the multilayer circuit board, thereby performing the transmission/reception of a signal between the thin film capacitor and a wiring provided in another layer. This configuration allows the thin film capacitor to be formed in every layer inside the multilayer circuit board, thus making it possible to increase the degree of freedom in the board design.

Different conductors are deposited so as to form the first electrode and the first wiring into one and the same pattern. This formation allows the electrode and the wiring pattern to be formed without damaging the above-described features and using a resist pattern formed by the same mask or film, which makes it possible to reduce the board manufacturing cost.

The second electrode is formed so that the area thereof is narrower than that of the thin film dielectric and the second electrode is positioned on the inner side of the thin film dielectric. This formation makes it possible to prevent the thin film capacitor from getting into a malfunction as a capacitor, thereby enhancing the reliability. Here, this malfunction occurs when the first electrode and the second electrode are electrically connected via an impurity adhering to an outer-circumference side surface of the thin film dielectric.

The coating of the thin film dielectric material can be performed to prevent the electrical short-circuit between the first electrode and the second electrode. This coating is effective on the manufacturing.

As the metal on the top portion of which the thin film dielectric can be grown epitaxially, it is preferable to use a metal selected from a group consisting of Ru, Pt, and Pd.

As the thin film dielectric that grows epitaxially on the metal selected from the group consisting of Ru, Pt, and Pd and that exhibits the high dielectric-constant, it is preferable to use a ceramic thin film of an oxide, the representative of which is strontium titanate, or a nitride.

A metal selected from a group consisting of Cu, Au, Ag and Al that have a small conductive loss is preferable as the first electrode and the second electrode.

Also, the first electrode is formed into a double-layer conductor layer having a first connection layer that is positioned on a plane of the first electrode opposite to the thin film dielectric and that is formed of a metal different from the metal of the first electrode. This formation increases the adhesion between the first electrode and the resin or the first wiring conductor bonded onto the plane of the first electrode opposite to the thin film dielectric, thereby being capable of enhancing the reliability. A metal selected from a group consisting of Cr, Mo, and Ti is preferable as the first connection layer as described above.

The second electrode is formed into a double-layer conductor layer having a second connection layer positioned on a plane facing the thin film dielectric and formed of a metal different from the metal of the second electrode. This formation increases the contact characteristics between the second electrode and the thin film dielectric, thereby being capable of enhancing the reliability. A metal selected from the group consisting of Cr, Mo, and Ti is preferable as the second connection layer as described above.

Also, of the first electrode and the second electrode, an electrode that is positioned nearer to a transmission-line conductor formed on the multilayer circuit board is set at the grounding potential. This setting makes it possible to reduce a signal interference between the transmission line and the electrode that has not been set at the grounding potential within the thin film capacitor having a capacity value with respect to the grounding potential. Consequently, no deterioration occurs in the performance of the electronic circuit equipment.

DESCRIPTION OF THE EMBODIMENTS

Figure 1:
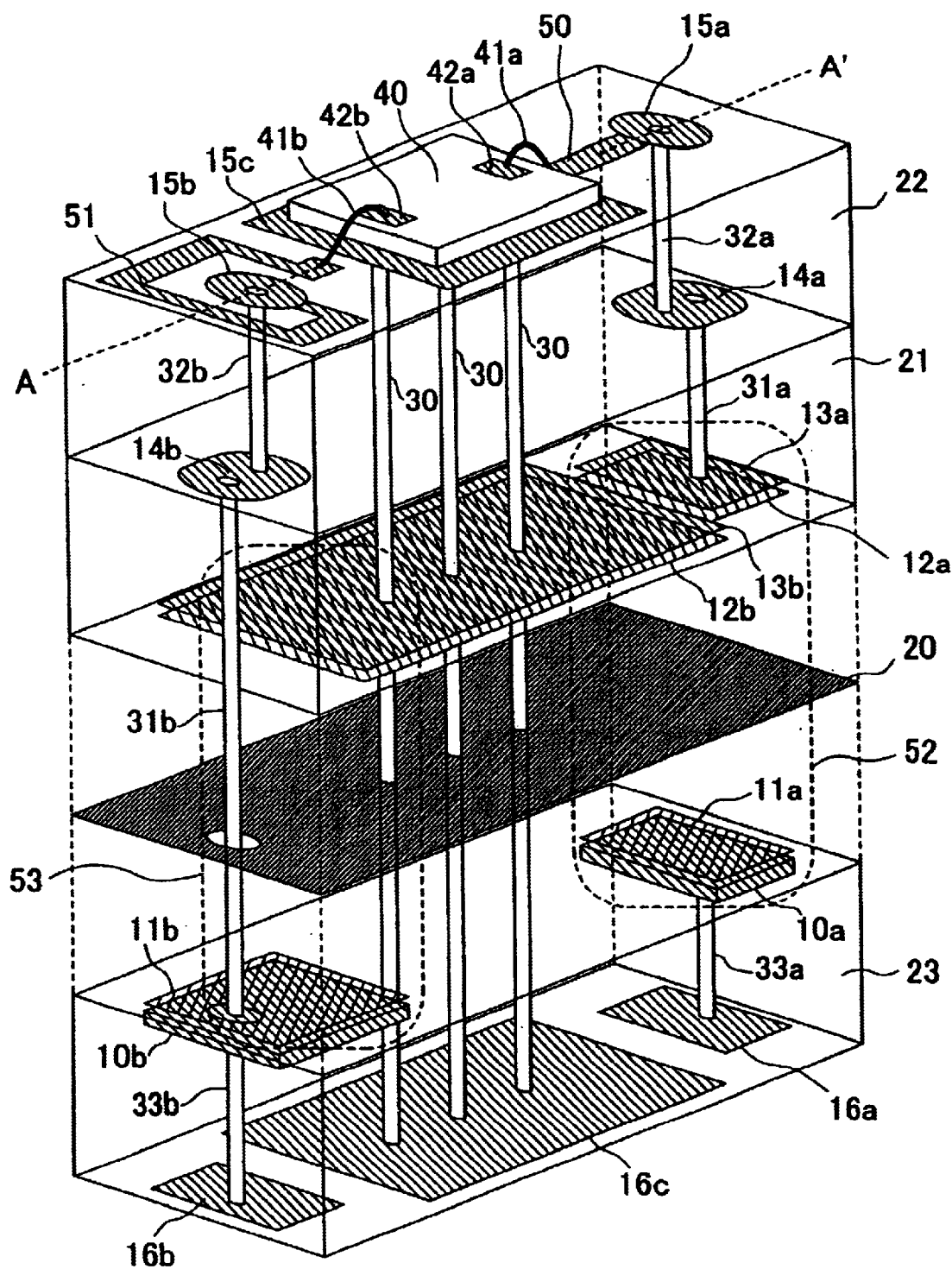
FIG. 1 is a perspective view for explaining a first embodiment of the electronic circuit equipment using the multilayer circuit board according to the present invention.

Hereinafter, referring to the drawings, the explanation will be given in more detail concerning the embodiments of the electronic circuit equipment using the multilayer circuit board according to the present invention. Incidentally, the same reference numerals in FIGS. 1 to 4 denote the same or similar configuration components.

1. First Embodiment

Figure 2A:
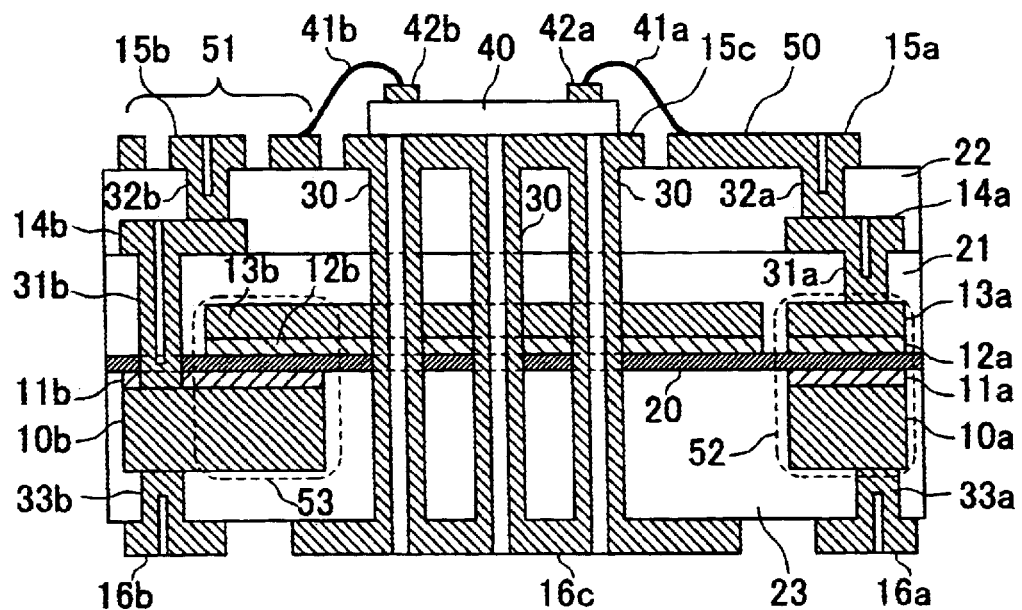
FIGS. 2A and 2B are a cross-sectional view and a diagram of the equivalent circuit, respectively, for explaining the first embodiment of the electronic circuit equipment using the multilayer circuit board according to the present invention.
Figure 2B:
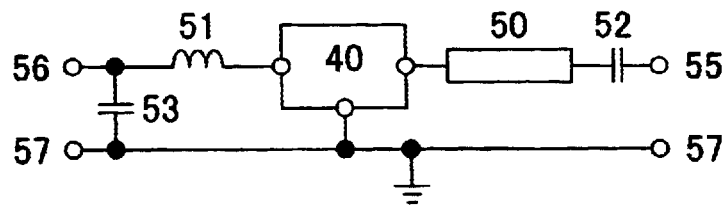

Using FIG. 1 and FIGS. 2A and 2B, the explanation will be given below concerning the first embodiment of the present invention. FIG. 1 is a perspective view of the electronic circuit equipment using the multilayer circuit board in the first embodiment. FIG. 2A is a cross-sectional view of the electronic circuit equipment cut off along a one-point chain line A—A' in FIG. 1. FIG. 2B is a diagram of the equivalent circuit for the electronic circuit equipment.

A thin film dielectric 20 is sandwiched between a first electrode 11a and a second electrode 13a that overlays the first electrode to each other, thereby forming a thin film capacitor 52. A second connection layer 12a the area of which is equal to that of the second electrode 13a is provided between the second electrode 13a and the thin film dielectric 20. A first wiring conductor 10a the area of which is equal to that of the first electrode 11a is provided on a plane of the first electrode 11a opposite to the thin film dielectric 20.

A back-surface conductor 16a provided on the back surface of the multilayer circuit board is connected to the first wiring conductor 10a via a via-hole 33a provided in a dielectric layer 23, thereby making it possible to perform, from the back-surface conductor 16a, the transmission/reception of a signal toward the first electrode side of the thin film capacitor 52. The back-surface conductor 16a corresponds to an input-and-output terminal 55 in the equivalent circuit. Also, the second electrode 13a is connected to an intermediate conductor 14a via a via-hole 31a provided in a dielectric layer 21, and the intermediate conductor 14a is connected to a front-surface conductor 15a via a via-hole 32a provided in a dielectric layer 22. A transmission-line conductor 50 is connected to the front-surface conductor 15a, and the transmission-line conductor 50 is connected via a bonding wire 41a to a pad 42a provided on a semiconductor element 40. This makes it possible to perform, from the pad on the semiconductor element via the transmission-line conductor 50, the transmission/reception of a signal toward the second electrode side of the thin film capacitor 52.

Similarly, the thin film dielectric 20 is sandwiched between a first electrode 11b differing from the first electrode 11a and a second electrode 13b having an overlaying portion with this first electrode and differing from the second electrode 13a, thereby forming a thin film capacitor 53. A second connection layer 12b the area of which is equal to that of the second electrode 13b is provided between the second electrode 13b and the thin film dielectric 20. A first wiring conductor 10b the area of which is equal to that of the first electrode 11b is provided on a plane of the first electrode 11b opposite to the thin film dielectric 20. A back-surface conductor 16b differing from the back-surface conductor 16a is connected to the first wiring conductor 10b via a via-hole 33b provided in the dielectric layer 23, thereby making it possible to perform, from the back-surface conductor 16b, the transmission/reception of a signal toward the first electrode side of the thin film capacitor 53. The back-surface conductor 16b corresponds to an input-and-output terminal 56 in the equivalent circuit. Furthermore, in a portion of the first electrode 11b where the first electrode 11b does not overlay the second electrode 13b, the first wiring conductor 10b is connected to an intermediate conductor 14b differing from the intermediate conductor 14a via a via-hole 31b provided in the dielectric layer 21, and the intermediate conductor 14b is connected to a front-surface conductor 15b differing from the front-surface conductor 15a via a via-hole 32b provided in the dielectric layer 22. An inductor 51 is connected to the front-surface conductor 15b, and the inductor 51 is connected via a bonding wire 41b to a pad 42b provided on the semiconductor element 40. Also, via through-holes 30 provided by penetrating the dielectric layers 21, 22, and 23, the second electrode 13b is connected to a back-surface conductor 16c further differing from the back-surface conductors 16a and 16b. Accordingly, setting the back-surface conductor 16c at the grounding potential allows the second electrode 13b to be set at the grounding potential. Here, a front-surface conductor 15c connecting the back surface of the semiconductor element 40 and further differing from the front-surface conductors 15a and 15b is also connected to the back-surface conductor 16c via the through-holes 30. The back-surface conductor 16c corresponds to a grounding terminal 57 in the equivalent circuit.

In the present embodiment, a planarized-surface treated rolled copper foil 70 µm thick has been used as the first wiring conductors, and Ru becoming the first electrodes has been deposited on the copper foil by 0.2 µm thick by sputtering. Moreover, strontium titanate is deposited as the thin film dielectric by 0.4 µm by sputtering, and Cr is deposited as the second connection layers on the strontium titanate by 0.05 µm by sputtering. Subsequently, 5 µm thick plated copper becoming the second electrodes is formed on the second connection layers. After the patterning is performed toward the respective layers, the multilayer circuit board has been formed based on an ordinary printed-circuit-board fabricating process.

Although, as is the case with the ordinary printed circuit board, an epoxy resin has been used as the dielectric layers in the multilayer circuit board, such a resin as polyimide or teflon may also be used. Also, copper has been used not only as the first wiring conductors and the second electrodes but also as the front-surface conductors, the intermediate conductors, the back-surface conductors, the through-holes, and the via-holes. Copper has the high electrical-conductivity, and thus copper is the most suitable as a wiring material required to transmit a signal with a low-loss. In the case as well where Au, Ag, or Al is used, the similar effect can be obtained.

The first electrodes are not limited to Ru, and a VIII group metal, e.g., Pt and Pd, may also be used. Concerning the selection of these metals, it is preferable to select a one the lattice constant of which is close to that of the thin film dielectric to be deposited thereon. This selection makes it easy to cause the thin film dielectric to grow epitaxially. Also, these metals are very resistant to the oxidization, and accordingly these metals also play a role of preventing the first wiring conductors from being oxidized by the thin film dielectric containing oxygen.

As the thin film dielectric has a higher dielectric-constant and a thinner thickness, the area of the thin film capacitor is made smaller, and thus the multilayer circuit board can be downsized even further. Although a ceramic thin film of the other oxides or nitrides may be used as the thin film dielectric, oxides exhibiting the perovskite structure, e.g., strontium titanate $SrTiO_3$ in the present embodiment and barium-strontium titanate $(Ba, Sr)TiO_3$, are especially suitable as the thin film dielectric since the perovskite structure oxides exhibit a high dielectric-constant.

The present structure has allowed the thin film dielectric of the high dielectric-constant strontium titanate to grow epitaxially on the first electrodes formed of Ru, and further has permitted the first wiring conductors and the second electrodes to be formed of the high electrical-conductivity copper. This condition has made it possible to implement the electronic circuit equipment using the multilayer circuit board that includes the small-sized and high-performance built-in thin film capacitor having a large per-area capacity value and a small electrode/wiring conductive loss.

The via-holes or the through-holes have been connected to the first wiring conductors and the second electrodes of the thin film capacitor, thereby making it possible to perform the transmission/reception of a signal with the conductors provided in the other layers. This condition has permitted the thin film capacitor to be formed inside the multilayer circuit board, thus making it possible to increase the degree of freedom in the board design.

The pattern formation of the first electrodes and the first wiring conductors has been performed by applying, to the double-layer conductors formed of Ru and copper, a resist pattern formed by the same film. This condition has made it possible to reduce the board manufacturing cost.

The second electrodes have been formed from the double-layer conductor layers having the second connection layers of Cr between the second electrodes and the thin film dielectric. This condition has increased the contact characteristics between the second electrodes and the thin film dielectric, thereby being capable of enhancing the reliability. The second connection layers are not limited to Cr, and a metal selected from the group consisting of Cr, Mo, and Ti is preferable as the second connection layers.

2. Second Embodiment

Figure 3:
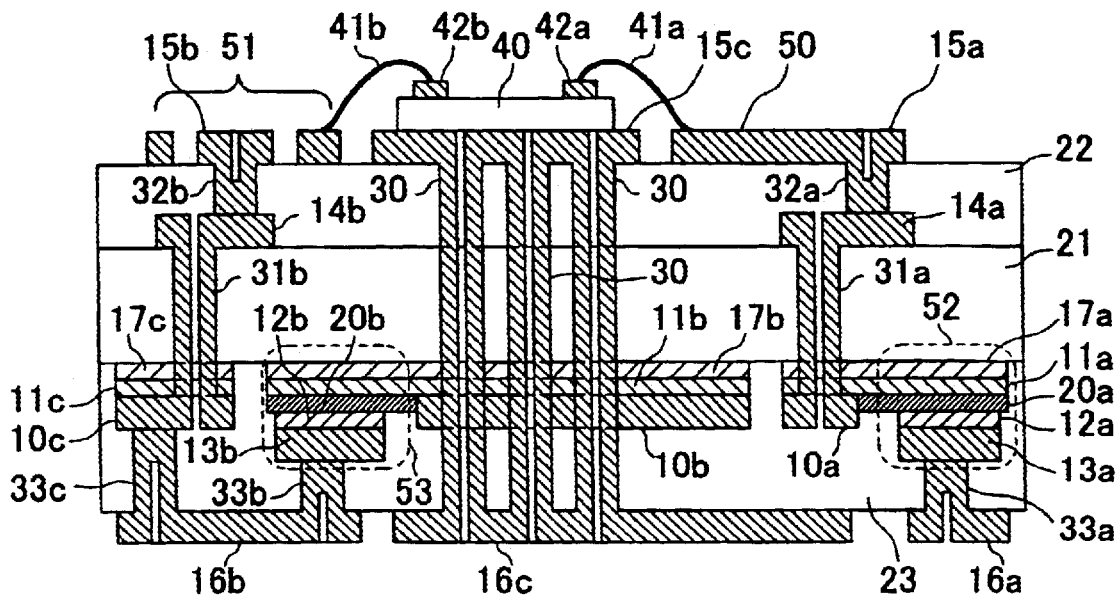
FIG. 3 is a cross-sectional view for explaining a second embodiment of the electronic circuit equipment using the multilayer circuit board according to the present invention.
Figure 4:
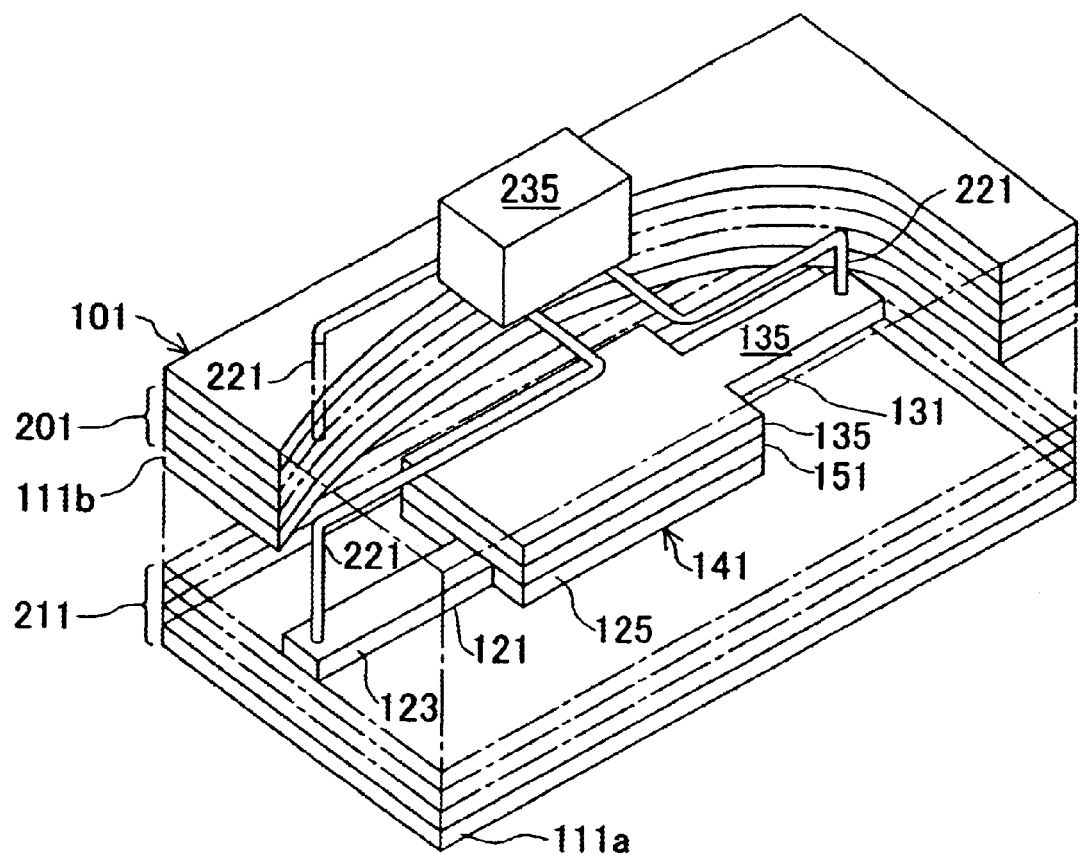
FIG. 4 is a perspective view for explaining the conventional multilayer circuit package.

FIG. 3 is a cross-sectional view of the electronic circuit equipment using the multilayer circuit board for explaining a second embodiment of the present invention. The equivalent circuit for the present electronic circuit equipment is the same as the one used in the first embodiment and illustrated in FIG. 2B.

A thin film dielectric 20a is sandwiched between the first electrode 11a and the second electrode 13a, thereby forming the thin film capacitor 52. The second connection layer 12a is provided between the second electrode 13a and the thin film dielectric 20a. The second electrode 13a is connected to the back-surface conductor 16a via the via-hole 33a provided in the dielectric layer 23. A first connection layer 17a is provided on a plane of the first electrode 11a opposite to the thin film dielectric 20a. The first wiring conductor 10a is provided at a portion of the first electrode 11a which is positioned on the thin film dielectric 20a side and does not overlay the second electrode 13a and from which the thin film dielectric 20a has been removed. The first electrode 11a is connected to the front-surface conductor 15a via the first wiring conductor 10a, the via-hole 31a provided in the dielectric layer 21, the intermediate conductor 14a, and the via-hole 32a provided in the dielectric layer 22.

In the present embodiment, a polyimide film 200 $\mu$m thick has been used as the dielectric layer 21, and thereon, Cr as the first connection layers by 0.05 $\mu$m thick, Ru to form the first electrodes by 0.2 $\mu$m, strontium titanate as the thin film dielectric by 0.3 $\mu$m, and Cr as the second connection layers by 0.05 $\mu$m have been deposited one after another by sputtering. After that, the patterning is performed in the order of the second connection layers and the thin film dielectric, and thereon, copper becoming the first wiring conductors and the second electrodes are formed by 5 $\mu$m by plating. After that, the patterning is performed toward the second electrodes, the first wiring conductors, the first electrodes, and the first connection layers. The conductors in the other layers, and the via-holes and the through-holes have been formed based on the ordinary printed-circuit-board fabricating process.

The above-described forming method permits the thin film dielectric to be formed on the surface of the highly planarized resin subsequently to the first connection layers and the first electrodes. This condition has made it possible to make the thickness of the thin film dielectric thinner which is planned for forming the capacitor without a pinhole, thereby being capable of further increasing the per-area capacity value of the thin film capacitor.

Also, Cr of which the first connection layers are formed has increased the close contact characteristics between the first electrodes and the dielectric layer 21 of the polyimide film, thereby being capable of enhancing the reliability. The first connection layers are not limited to Cr, and a metal selected from the group consisting of Cr, Mo, and Ti is preferable as the first connection layers.

According to the present invention, it becomes possible to obtain the electronic circuit equipment using the multilayer circuit board that includes the built-in thin film capacitor having the high dielectric-constant thin film dielectric.

It will be further understood by those skilled in the art that the foregoing description has been made on embodiments of the invention and that various changes and modifications may be made in the invention without departing from the spirit of the invention and scope of the appended claims.

What is claimed is:

1. An electronic circuit equipment using a multilayer circuit board on which a semiconductor chip is mounted, comprising:
    a thin film capacitor provided on said multilayer circuit board, wherein a first electrode of said thin film capacitor and a first wiring of said multilayer circuit board which wiring is formed of a metal different from a metal of said first electrode, are electrically connected to each other, a second electrode of said thin film capacitor and a second wiring of said multilayer circuit board being electrically connected to each other, and a thin film dielectric of said thin film capacitor is formed by being grown epitaxially with said first electrode as its base.

2. The electronic circuit equipment using said multilayer circuit board as claimed in claim 1, wherein said multilayer circuit board includes a resin and a conductor, said thin film capacitor is buried in said resin, and at least one of electrical connections between said wirings and said electrodes is established via a hole bored in said resin.

3. The electronic circuit equipment using said multilayer circuit board as claimed in claim 1, wherein said first electrode and said first wiring have the same pattern, and are laminated.

4. The electronic circuit equipment using said multilayer circuit board as claimed in claim 1, wherein said first electrode is a metal selected from a group consisting of Ru, Pt, and Pd.

5. The electronic circuit equipment using said multilayer circuit board as claimed in claim 1, wherein said first electrode has a first connection layer positioned on a plane of said first electrode opposite to said thin film dielectric and formed of a metal different from a conductor of said first electrode, said first connection layer being a metal selected from a group consisting of Cr, Mo, and Ti.

6. The electronic circuit equipment using said multilayer circuit board as claimed in claim 1, wherein said second electrode has a second connection layer positioned on a plane facing said thin film dielectric and formed of a metal different from a conductor of said second electrode, said second connection layer being a metal selected from a group consisting of Cr, Mo, and Ti.

7. The electronic circuit equipment using said multilayer circuit board as claimed in claim 1, wherein, one of said first electrode and said second electrode, which faces a conductor of a transmission line formed on said multilayer circuit board is set at a grounding potential.

8. The electronic circuit equipment using said multilayer circuit board as claimed in claim 4, wherein said thin film dielectric is formed of strontium titanate.

9. An electronic circuit equipment using a multilayer circuit board on which a semiconductor chip is mounted, comprising:
    a thin film capacitor provided on said multilayer circuit board, wherein a first electrode of said thin film capacitor and a first wiring of said multilayer circuit board, which wiring is formed of a metal different from a metal of said first electrode, are electrically connected to each other, a second electrode of said thin film capacitor and a second wiring of said multilayer circuit board being electrically connected to each other, and a thin film dielectric of said thin film capacitor is formed by being grown epitaxially with said first electrode as its base, wherein an area of said second electrode is narrower than an area of said thin film dielectric, and said second electrode is located on an inner side of said thin film dielectric.

10. A multi-layer electronic circuit board having an embedded thin film capacitor comprising
    a first dielectric circuit board layer;
    a first electrically conductive layer supported on said first dielectric layer;
    an electrode layer supported on said first electrically conductive layer, said electrode layer being a metal and having a composition different from that of said first electrically conductive layer;
    an epitaxial dielectric layer supported on said electrode layer;
    a metallic connection layer overlying said epitaxial dielectric layer and in contact therewith;

a second electrically conductive layer overlying and in contact with said metallic connection layer; and a second circuit board dielectric layer covering said second electrically conductive layer.

11. The multi-layer electronic circuit board of claim 10, wherein said metal of said electrode layer is selected from the group consisting of Ru, Pt. and Pd.

12. The multi-layer electronic circuit board of claim 10, wherein said epitaxial dielectric layer is strontium titanate.

13. The multi-layer electronic circuit board of claim 10, wherein said metallic connection layer is formed from a metal selected from the group consisting of Cr, Mo, and Ti.

* * * * *